United States Patent [19]

Matsumura et al.

[11] 4,383,174
[45] May 10, 1983

[54] PYROELECTRIC DETECTOR AND METHOD FOR MANUFACTURING THE SAME

[75] Inventors: Sadao Matsumura, Inagi; Katsuyoshi Fukuta, Kawasaki; Hitoshi Hirano, Kanagawa, all of Japan

[73] Assignee: Tokyo Shibaura Denki Kabushiki Kaisha, Kanagawa, Japan

[21] Appl. No.: 190,161

[22] Filed: Sep. 23, 1980

[30] Foreign Application Priority Data

Sep. 25, 1979 [JP]  Japan .................................. 54-122947
Mar. 25, 1980 [JP]  Japan .................................. 55-38043

[51] Int. Cl.$^3$ ............................................. G01J 1/00
[52] U.S. Cl. .................................................. 250/338
[58] Field of Search ................ 250/338, 339, 340, 349

[56] References Cited

U.S. PATENT DOCUMENTS 3,985,685  10/1976  Houlton et al. ................. 250/338 X
4,060,729  11/1977  Byer et al. ............................ 250/338
4,224,520   9/1980  Greene et al. ........................ 250/338
4,293,768  10/1981  Adachi et al. ........................ 250/338

FOREIGN PATENT DOCUMENTS 51-12272  4/1976  Japan .

OTHER PUBLICATIONS

Article: Sensitive LiTaO$_3$ Pyroelectric Detector by C. B. Roundy and R. L. Byer, *Journal of Applied Physics*, vol. 44, No. 2, Feb. 1973.
Nikkei Electronics Advertisement, 1979 catalog.
Application Note–Molectron, for Series P1–10, P1–10H, P1–30, P1–40, P1–50, P1–60 and P1–70 pyroelectric detectors.

*Primary Examiner*—Davis L. Willis
*Attorney, Agent, or Firm*—Schuyler, Banner, Birch, McKie & Beckett

[57] ABSTRACT

A device for detecting infrared rays using the pyroelectric effect, namely a pyroelectric detector, and methods for manufacturing the pyroelectric detector, are disclosed. The pyroelectric detector comprises a pyroelectric material, an electrode for receiving infrared rays placed on one face of the pyroelectric material, a shield electrode placed at the other face of the pyroelectric material, a substrate made of a semiconductor or conductive material which is fastened to the shield electrode, the substrate having a hole corresponding in position to the position of the infrared receiving electrode and a stand to which the substrate is fastened. The method for manufacturing the pyroelectric detector comprises the steps of forming a shield electrode at one face of a pyroelectric wafer, making holes in a substrate, fastening the substrate to the shield electrode, grinding the other of the wafer, forming electrodes on the other face of the wafer for receiving infrared rays, the position of the electrodes corresponding to the position of the holes, and dicing the pyroelectric material between the holes to form a single pyroelectric detector.

8 Claims, 9 Drawing Figures

PYROELECTRIC DETECTOR AND METHOD FOR MANUFACTURING THE SAME

BACKGROUND OF THE INVENTION

This invention relates to a device for detecting infrared rays utilizing the pyroelectric effect and methods for manufacturing the same.

Generally, pyroelectric materials are used in pyroelectric detectors for detecting infrared rays by utilizing the pyroelectric effect. However, if the heat capacity of a the pyroelectric material is great, the pyroelectric material cannot respond to a fast change in the energy of infrared rays. Therefore, various techniques are used in the prior art to reduce the heat capacity of pyroelectric materials. For example, by reducing the thickness of the pyroelectric material to about 30–50 μm, heat capacity is reduced.

In the prior art, heat capacity also is reduced by exposing the pyroelectric material to air and mounting the pyroelectric material on a heat insulated substrate. A technique for exposing the pyroelectric material to air is shown in FIG. 1. A piezoelectric crystal 3 is mounted on a stand 5 by the wires 4 and 4'. The electrode 1 for receiving infrared rays and the shield electrode 2 are formed on different sides of the piezoelectric crystal 3. Although heat capacity is reduced, the pyroelectric detector shown in FIG. 1 is not reliable or durable; it also is very difficult to manufacture and treat the pyroelectric detector because the pyroelectric crystal 3 is so thin.

Another prior art technique is shown in FIG. 2. The shield electrode 2, which is formed on one side of piezoelectric crystal 3, is connected to the heat insulated substrate 6 which is in turn mounted on the stand 5. The pyroelecric detector shown in FIG. 2 has the disadvantage that it is difficult to connect wire 4 to the shield electrode 2.

Another known structure is shown in FIG. 3. This structure is described in Japanese patent publication No. 12272/1976 (Tokkosho). The shield electrode 2, which is mounted on one side of piezoelectric crystal 3, is formed around a heat insulated substrate 6 and mounted on stand 5 by conductive glue. The heat insulated substrate 6 is covered by an SnO2 film 7 so it is unnecessary to connect the shield electrode 2 to stand 5 by wire 4. However, because the piezoelectric crystal 3 is mounted on the substrate 6, the heat capacity is great which prevents the detector from responding to fast changes in the energy of infrared rays. It also is difficult to manufacture and treat the detector shown in FIG. 3 because it is necessary to mount a very thin pyroelectric crystal. In FIGS. 1–3, electrode 1 is connected to lead terminal 8 by wire 4'. Terminal 8 is insulated from stand 5 by insulation 9.

SUMMARY OF THE INVENTION

It is one object of this invention to provide a pyroelectric detector which can respond to fast changes in the energy of infrared rays. It is another object of this invention to provide a pyroelectric detector having a strong structure, high durability and high reliability.

It is further another object of this invention to provide an improved method for manufacturing pyroelectric detectors using thin pyroelectric material. A related object of this invention is to provide a method which can be readily used for mass production of pyroelectric detectors.

According to this invention, the foregoing and other objects are attained by providing an improved pyroelectric detector. This pyroelectric detector comprises a pyroelectric material, an infrared receiving electrode mounted on one face of the pyroelectric material for receiving infrared rays, a shield electrode mounted on the other face of the pyroelectric material, a substrate made of a semiconductive or conductive material having a hole broader than the infrared receiving electrode, the substrate being connected to the shield electrode by conductive glue, and a stand to which the substrate is connected by conductive glue.

Also, according to this invention, the foregoing and other objects are attained by providing various methods of manufacturing pyroelectric detectors. A shield electrode is formed on one face of a wafer of pyroelectric material and holes are made in a substrate of semiconductive or conductive material which is glued to the shield electrode by conductive glue. The other face of the wafer of pyroelectric material is ground and infrared receiving electrodes are formed thereon for receiving infrared rays. Each infrared receiving electrode, which has an area substantially less than the area of each hole in the substrate, is positioned over one of the holes. The wafer of pyroelectric material then is diced at positions between the holes.

BRIEF DESCRIPTION OF THE DRAWINGS

The exact nature of this invention, as well as other objects and advantages thereof, will be readily apparent from consideration of the following specification and drawings.

FIG. 7i is taken along line 7i—7i of FIG. 7h.

DESCRIPTION OF THE PREFERRED EMBODIMENT

Figure 1:
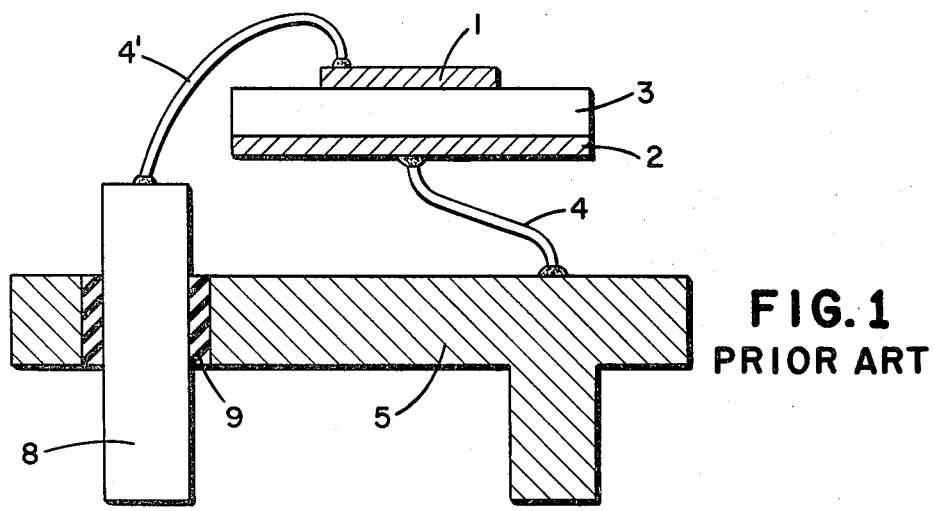
FIG. 1 shows a longitudinal sectional view of one prior art embodiment of a pyroelectric detector.
Figure 2:
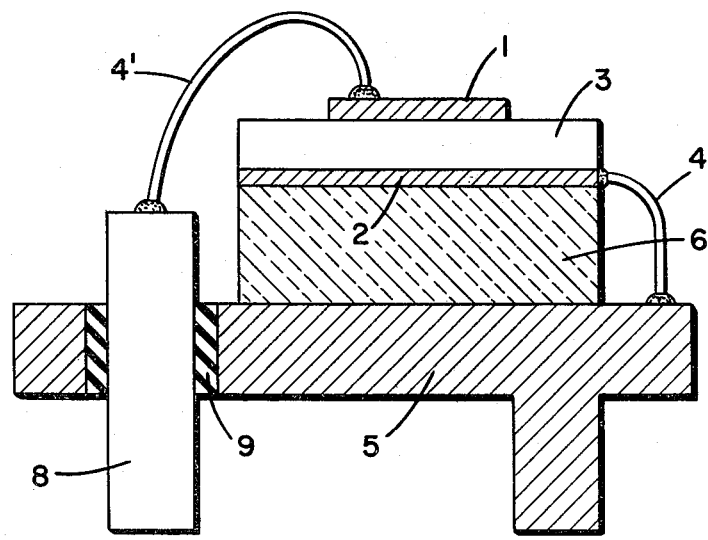
FIG. 2 shows a longitudinal sectional view of another prior art embodiment of a pyroelectric detector.
Figure 3:
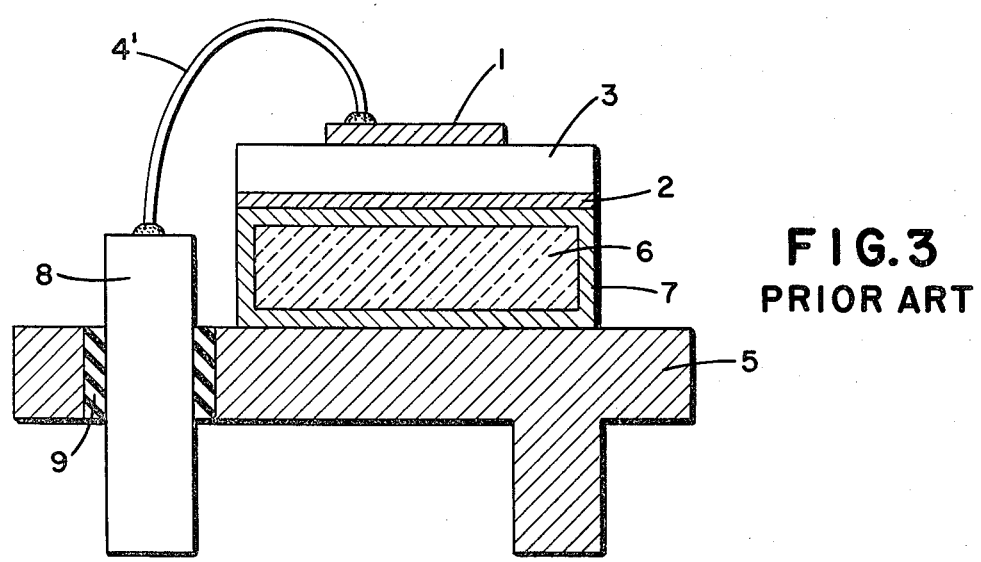
FIG. 3 shows a longitudinal sectional view of a third prior art embodiment of a pyroelectric detector.
Figure 4A:
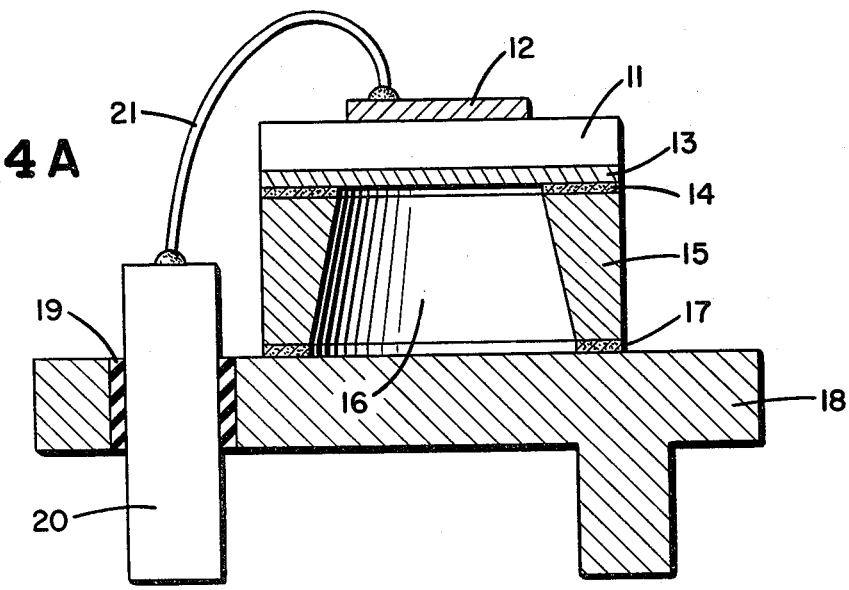
FIG. 4A shows a longitudinal sectional view of one embodiment of the pyroelectric detector of the present invention.

FIG. 4A shows a cross-sectional view of the preferred embodiment of the pyroelectric detector of the invention. The crystal 11 is a wafer of pyroelectric material, such as a pyroelectric crystal like LiTaO$_3$. The pyroelectric crystal 11 is approximately 50 μm thick and measures 3.5 mm by 3.5 mm.

An infrared receiving electrode 12, which receives infrared rays, is mounted on the upper face of pyroelectric crystal 11. The infrared receiving electrode 12 is a disk which measures 2 mm in diameter. At the other face of pyroelectric crystal 11 is a shield electrode 13; shield electrode 13 covers the whole face of crystal 11. A substrate 15 made of semiconductive material such as silicon is fastened to the shield electrode 13 by conductive glue 14. The main plane of silicon substrate 15 has an orientation in the (100) plane; it measures 250 μm thick and is a square measuring 3.5 mm by 3.5 mm. In the center of silicon substrate 15 is a square hole 16 which measures 2.5 mm by 2.5 mm. The hole 16 is made by selective etching. The position of the open area of hole 16 corresponds to the position of infrared receiving electrode 12 although hole 16 is substantially broader than infrared receiving electrode 12. The legs of silicon substrate 15 are fastened to stand 18 by conductive glue 17. The stand 18 and the lead terminal 20 are insulated from each other by insulating material 19. A lead wire 21 electrically connects lead terminal 20 and the infrared receiving electrode 12. Lead wire 21 is made of a material such as gold or aluminum.

Figure 4B:
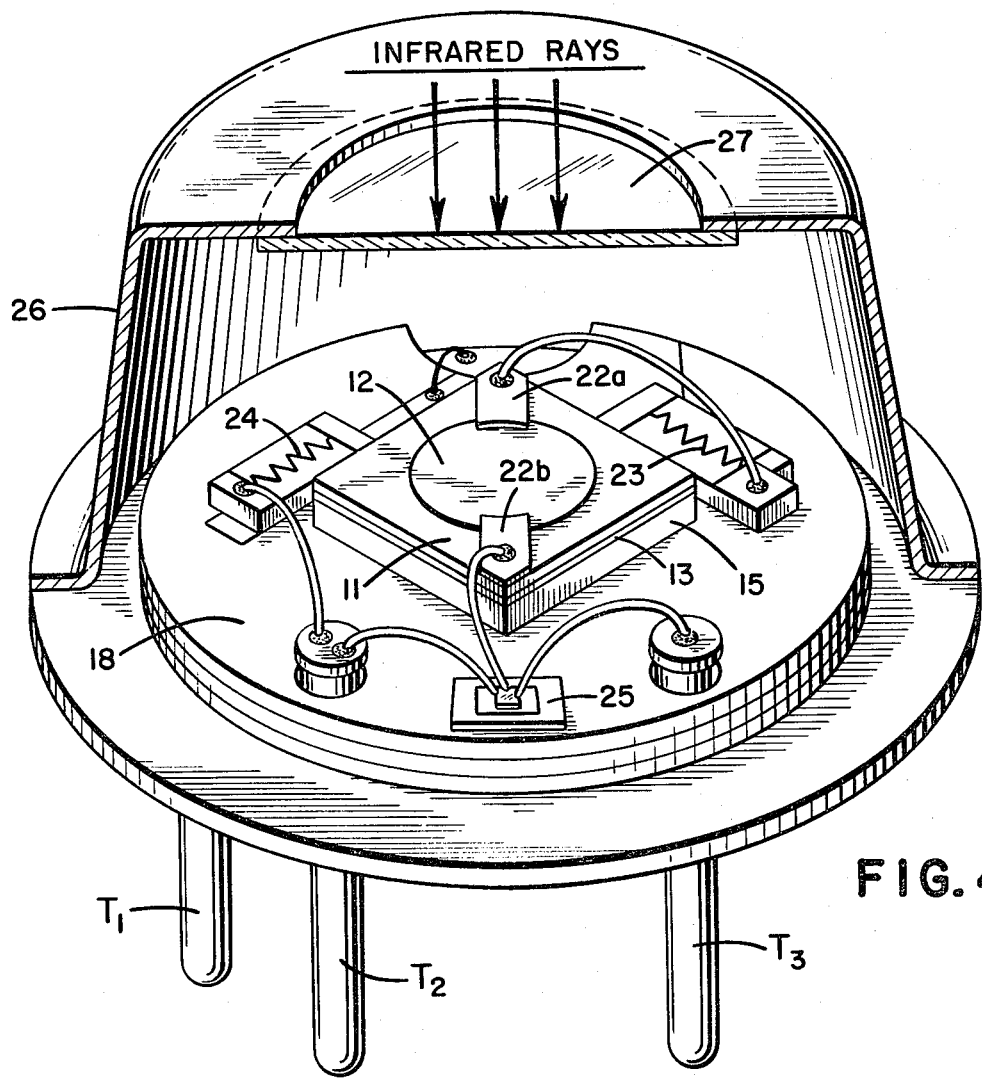
FIG. 4B shows a perspective view, partly in section, of the pyroelectric detector shown in FIG. 4A.
Figure 5:
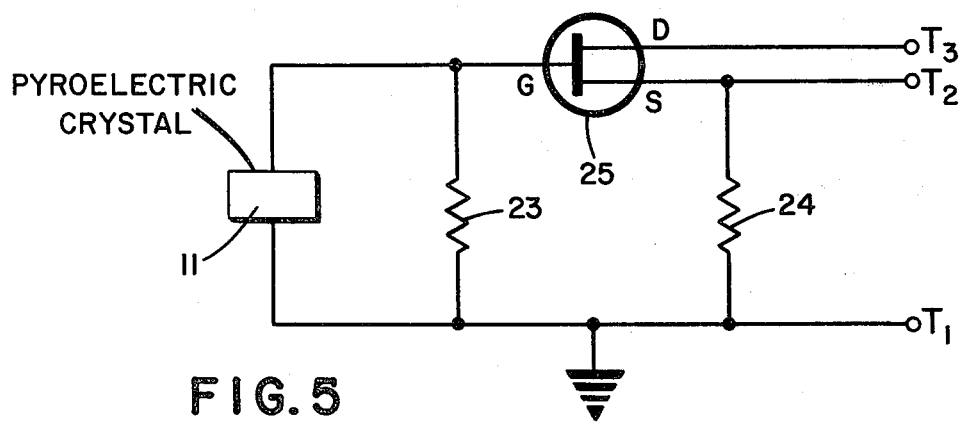
FIG. 5 shows a wiring diagram for the pyroelectric detector.

The pyroelectric detector shown in FIG. 4A is mounted and assembled in a package as shown in FIG. 4B and an electric circuit for the pyroelectric detector of FIG. 4B is shown in FIG. 5. In this embodiment, infrared receiving electrode 12 contacts conductive supporting members 22a and 22b. On the stand next to pyroelectric crystal 11, resistors 23 and 24 and field effect transistor FET 25 are mounted. Stand 18 is hermetically sealed with $N_2$ gas by cap 26; cap 26 has a silicon window 27 at the center. Three pins or terminals T1, T2, and T3 project through stand 18. The pin T1, which is grounded, is connected directly to stand 18; the pin T2 is connected to resistor 24 and the source of FET 25; and the pin T3 is connected to the drain of FET 25. Conductive supporting member 22b is connected to the gate of FET 25 and conductive supporting member 22a is connected to resistor 23. Resistors 23 and 24, which also are connected to stand 18, have resistance values of $10^{11}$ and $10^4$ ohms, respectively. When infrared rays pass through silicon window 27, they strike infrared receiving electrode 12 producing an output voltage between pin T1 and pin T2.

In the embodiment shown in FIGS. 4A and 4B, the heat capacity is small because of the hole in substrate 15. Also, it is unnecessary to interconnect shield electrode 13 and stand 18 with wire because substrate 15 is made of conductive or semiconductive material such as silicon and the substrate is fastened by conductive glue 14 and 17. Furthermore, this pyroelectric detector is durable because pyroelectric crystal 11 is supported by substrate 15.

Figure 6:
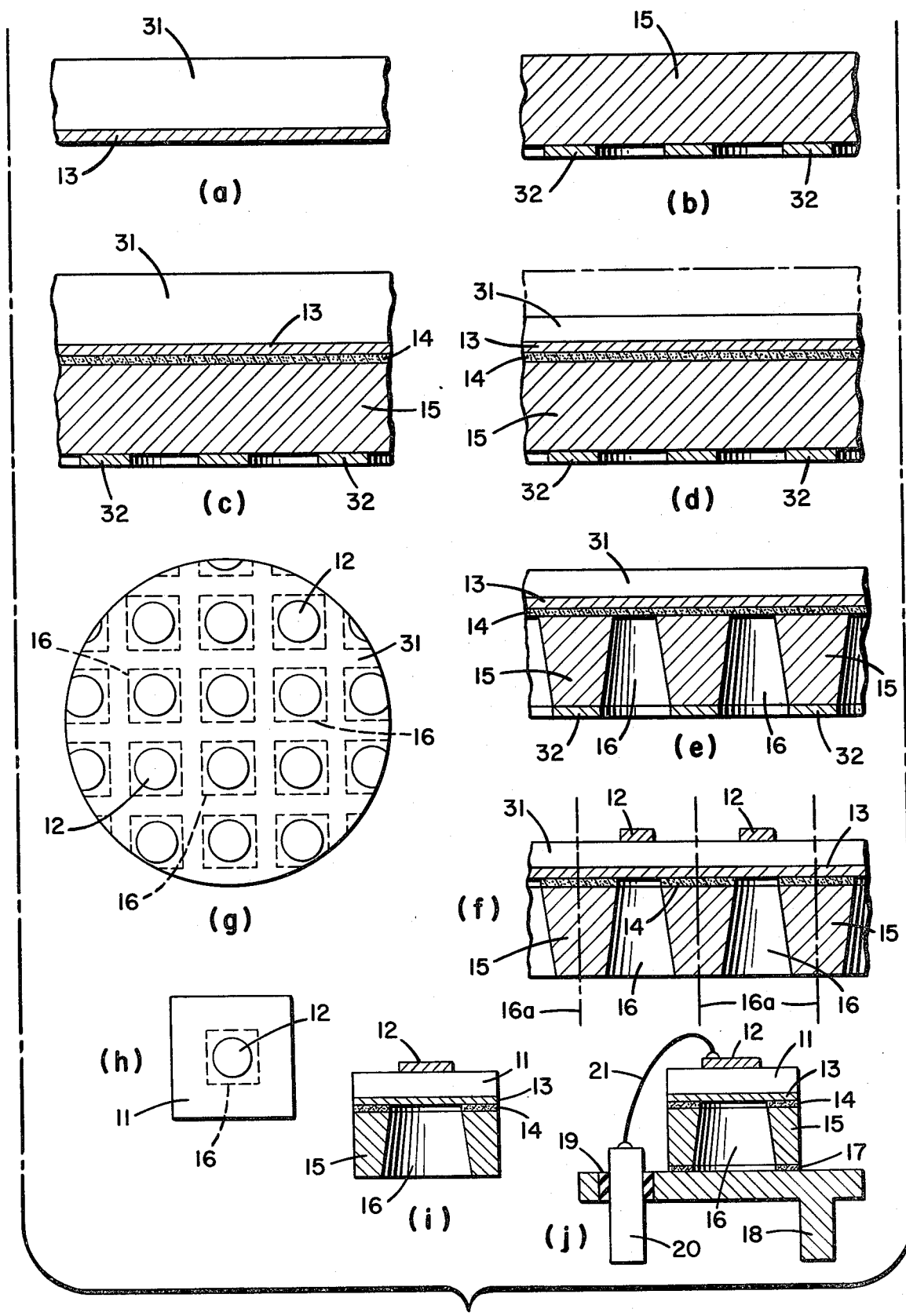
FIG. 6 illustrates a sequence of steps in accordance with one method of making the pyroelectric detector.

The pyroelectric detector shown in FIG. 4A is manufactured in accordance with the method shown in FIG. 6. In FIG. 6(a), a shield electrode 13 is formed on a pyroelectric crystal wafer 31 which measures 63 mm in diameter and 250 μm thick and which is made of a Z substrate of $LiTaO_3$. The shield electrode 13, which may be made of nichrome, is formed by vacuum evaporation or sputtering. In FIG. 6(b), an oxide film is formed on one face of a silicon substrate 15 which measures 63 mm in diameter and 250 μm thick. The oxide film 32 has square holes measuring 2.8 mm×2.8 mm and it acts as a mask pattern for etching. As shown in FIG. 6(c), the other face of silicon substrate 15 is fastened to the shield electrode 13 of the wafer 31 by conductive glue 14. Then, as shown in FIG. 6(d), the other face of the pyroelectric crystal wafer 31 is ground until the wafer achieves a thickness of 50 μm.

The combined pyroelectric crystal wafer 31 and silicon substrate 15 is dipped into liquid Hydrazine at 100° C. The Hydrazine as a fast etching rate in the <100> direction and a slow etching rate in the <111> direction. Therefore, silicon substrate 15 is etched selectively at a 57° angle against the (100) face of the crystal. By selective etching, square holes 16, which each measure 2.5 mm×2.5 mm, are made in silicon substrate 15 as shown in FIG. 6(e). As shown in FIG. 6(f), the oxide film 32 is removed and infrared receiving electrodes 12 are formed on the ground face of wafer 31. Each electrode 12 is a disk measuring 2.0 mm in diameter. The position of each electrode 12 corresponds to the position of a hole 16 and each electrode 12 has an area substantially less than the area of the corresponding hole 16.

FIG. 6(g) is a top plan view of the wafer 31 after completion of the steps in FIGS. 6(a)-(f). In FIG. 6(g), the dotted line squares indicate holes 16 although the actual distance between holes 16 along lines 16a (FIG. 6f) is greater than shown in FIG. 6(g). The wafer 31 is diced between holes 16 by a dicing machine to form a plurality of chips as shown in FIGS. 6(h) and 6(i). The chip then is mounted on stand 18 and fastened by conductive glue 17 as shown in FIG. 6(j).

The method shown in FIG. 6 makes it easy to manufacture pyroelectric detectors because one large wafer is used. Therefore, it is possible to mass-produce the pyroelectric detectors. Also, by using a universal dicing machine, cheap pyroelectric detectors can be obtained.

Various modifications can be made in the method shown in FIG. 6. Instead of the silicon substrate 15, substrates made of Ge, GaAs, or GaP can be used. Also, the step of making holes may be done before the step of grinding the other face of pyroelectric crystal wafer 31.

Figure 7:
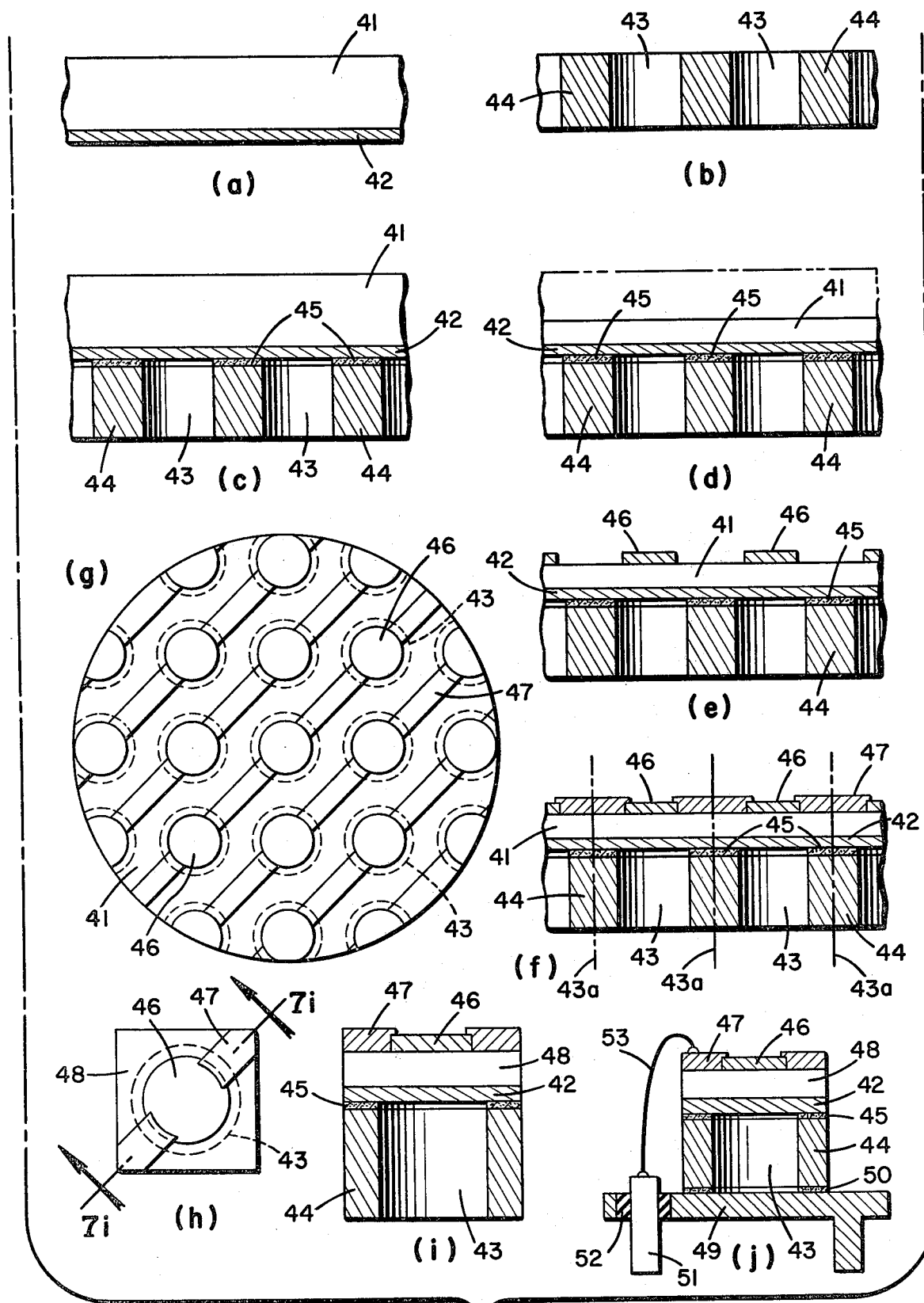
FIG. 7 illustrates a sequence of steps in accordance with another method of making the invention.

FIG. 7 shows another embodiment of the invention for manufacturing pyroelectric detectors. A shield electrode 42 is formed on one side of pyroelectric crystal wafer 41 in FIG. 7(a). As shown in FIG. 7(b), circular holes 43 are made through a substrate 44. The substrate 44 is made of a semiconductive or conductive material such as Si, Ge, GaAs, GaP, or metal. Circular holes 43 are made by a conventional mechanical process such as an ultrasonic horn method or a sand brass method.

As shown in FIG. 7(c), substrate 44 is fastened to the shield electrode 42 of the wafer 41 by conductive glue 45. In FIG. 7(d), the other face of the pyroelectric crystal wafer 41 is ground until the wafer is about 50 μm thick. In FIG. 7(e), on the ground face of wafer 41, infrared receiving electrodes 46 are formed. Each of the infrared receiving electrodes 46 is a disk, and the diameter of each disk is less than the diameter of each circular hole 43. The position of each infrared receiving electrode 46 corresponds to the position a hole 43. Then, as shown in FIGS. 7(f) and (g), bonding electrodes 47 are formed between infrared receiving electrodes 46. FIG. 7(g) shows a top plan view of the wafer 41 in which holes 43 are designated by dotted lines.

The wafer 41 shown in FIG. 7(g) is diced into chips 48 by a universal dicing machine between circular holes 43 along lines 43a (FIG. 7f). FIGS. 7(h) and 7(i) show an individual chip. The chip of pyroelectric crystal 48 is mounted on stand 49 by conductive glue 50 as shown in FIG. 7(j). A lead terminal 51, ehich is supported by insulating material 52, is electrically connected to bonding electrode 47 by lead wire 53. Bonding electrode 47 corresponds to conductive supporting members 22a and 22b in FIG. 4B. The pyroelectric detector in FIG. 7(i) is assembled as shown in FIG. 4B.

In the method shown in FIG. 7, the step of making holes is done by a mechanical process, and the time to manufactue pyroelectric detectors is short. The pyroelectric detector manufactured according to FIG. 7 is more durable than the pyroelectric detector of FIG. 6 because the hole 43 in substrate 44 is circular and the contact area between substrate 44 and stand 49 is large.

Figure 8:
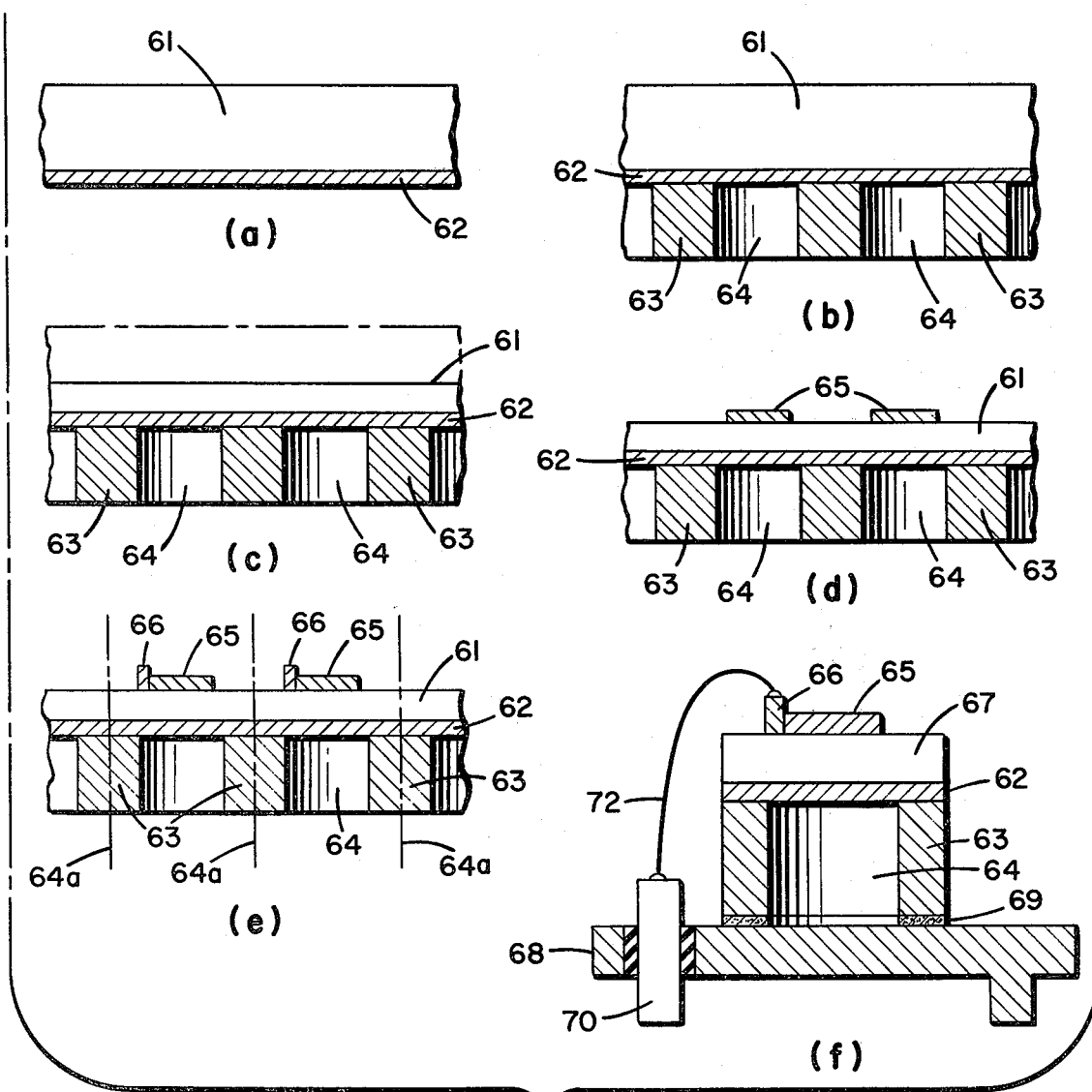
FIG. 8 illustrates a sequence of steps in accordance with a further embodiment of the method of the invention.

FIG. 8 shows yet another embodiment of the invention for manufacturing pyroelectric detectors. A shield electrode 62 is formed on one side of pyroelectric crystal wafer 61 in FIG. 8(a). Next, as shown in FIG. 8(b), a substrate 63 made of conductive thick-film paste and having circular holes 64 is formed on the shield electrode 62. The conductive thick-film paste is applied to the shield electrode 62, except in areas where the holes 64 are made, by screen printing for one hour. The conductive thick-film paste then is baked for one hour.

As shown in FIG. 8(c), the other face of pyroelectric crystal wafer 61 is ground until the thickness is about 50 $\mu$m. As shown in FIG. 8(d), on the ground face of wafer 61, infrared receiving electrodes 65 are formed. The infrared receiving electrodes 65 are formed by sputtering or vacuum evaporation of nichrome. Each of the infrared receiving electrodes 65 is a disk which measures 2.0 mm in diameter; the diameter of electrodes 65 is less than the diameter of each of the circular holes 64. The position of each electrode 65 corresponds to the position of a hole 64. Bonding electrodes 66 are formed adjacent to and in contact with the infrared receiving electrodes 65 as shown in FIG. 8(e). Bonding electrodes 66, which are made of aluminum about 1 $\mu$m thick, are formed by vacuum evaporation.

The wafer 61 is diced between holes 64 at the dot-dash lines 64a shown in FIG. 8(e) by a universal dicing machine to form individual chips. A chip then is mounted on stand 68 and fastened by conductive glue 69. Terminal 70 is connected to electrode 66 by wire 72. The chip 67 is assembled and packaged as shown in FIG. 4B.

In the method shown in FIG. 8, it is easy to manufacture pyroelectric detectors because a substrate 63 made of conductive thick-film paste is directly formed on the pyroelectric crystal wafer 61 without making holes.

In all the embodiments of the method of this invention, pyroelectric crystals such as a crystal of $LiTaO_3$ are used as elements for detecting infrared rays. Other pyroelectric materials can be used such as triglycine sulphate (TGS), strontium barium niobate (SBN), $PbTiO_3$ and PZT-type ferroelectric ceramics.

Although illustrative embodiments of the invention have been described in detail with reference to the accompanying drawings, it is to be understood that various changes and modifications could be effected therein by are skilled in the art without departing from the scope and spirit of the invention.

We claim:

1. A pyroelectric detector comprising:
    a pyroelectric material;
    an infrared receiving electrode mounted on one face of said pyroelectric material for receiving infrared rays;
    a shield electrode placed at the other face of said pyroelectric material;
    a substrate made of a material selected from the group consisting of semiconductive and conductive material fastened to said shield electrode by conductive glue, said substrate having a hole substantially broader than said infrared receiving electrode; and
    a stand to which said substrate is fastened by conductive glue.

2. A pyroelectric detector as set forth in claim 1 wherein said substrate is made of silicon.

3. A pyroelectric detector as set forth in claim 1 wherein said substrate is made of germanium.

4. A pyroelectric detector as set forth in claim 1 wherein said substrate is made of GaAs.

5. A pyroelectric detector as set forth in claim 1 wherein said substrate is made of GaP.

6. A pyroelectric detector as set forth in claim 1 wherein said substrate is made of a metal.

7. A pyroelectric detector as set forth in claim 1 wherein said substrate is made of conductive thick-film paste.

8. A pyroelectric detector as set forth in claim 1 wherein said pyroelectric material is $LiTaO_3$ crystal.

* * * * *

UNITED STATES PATENT AND TRADEMARK OFFICE
CERTIFICATE OF CORRECTION

PATENT NO. : 4,383,174
DATED : May 10, 1983
INVENTOR(S) : Sadao Matsumura et al.

It is certified that error appears in the above—identified patent and that said Letters Patent is hereby corrected as shown below:

Please delete the title of the invention "Pyroelectric Detector and Method for Manufacturing the Same" and insert --PYROELECTRIC DETECTOR FOR DETECTING INFRARED RADIATION-- on the face of the patent and column 1, lines 1-2.

Signed and Sealed this

Twenty-eighth Day of June 1983

[SEAL]

Attest:

GERALD J. MOSSINGHOFF

*Attesting Officer*    *Commissioner of Patents and Trademarks*